(12) United States Patent
Amiotti (10) Patent No.: US 7,534,658 B2
(45) Date of Patent: May 19, 2009

(54) PROCESS FOR MANUFACTURING MICROELECTRONIC, MICROOPTOELECTRONIC OR MICROMECHANICAL DEVICES

(75) Inventor: Marco Amiotti, Milan (IT)

(73) Assignee: SAES Getters S.p.A., Lainate (Milan) (IT)

( * ) Notice: Subject to any disclaimer, the term of this patent is extended or adjusted under 35 U.S.C. 154(b) by 0 days.

(21) Appl. No.: 11/067,526

(22) Filed: Feb. 25, 2005

(65) Prior Publication Data

US 2005/0158914 A1 Jul. 21, 2005

Related U.S. Application Data

(62) Division of application No. 10/201,657, filed on Jul. 19, 2002, now Pat. No. 6,897,551.

(30) Foreign Application Priority Data

| Jul. 20, 2001 | (IT) | ................ MI01A001558 |
| Apr. 3, 2002 | (IT) | ................ MI02A000688 |

(51) Int. Cl.
*H01L 23/20* (2006.01)

(52) U.S. Cl. ................ 438/115; 438/125

(58) Field of Classification Search ........ 438/115, 438/125; 257/682; 252/194
See application file for complete search history.

(56) References Cited

U.S. PATENT DOCUMENTS

| 3,214,381 A | 10/1965 | Baldauf et al. |
| 4,630,095 A | 12/1986 | Otsuka et al. |
| 5,032,461 A | 7/1991 | Shaw et al. |
| 5,083,466 A | 1/1992 | Holm-Kennedy et al. |
| 5,108,026 A | 4/1992 | Su et al. |
| 5,192,240 A | 3/1993 | Komatsu |
| 5,395,650 A | 3/1995 | Holl et al. |
| 5,411,918 A | 5/1995 | Keible et al. |
| 5,520,563 A | 5/1996 | Wallace et al. |
| 5,599,749 A | 2/1997 | Hattori |
| 5,614,785 A | 3/1997 | Wallace et al. |
| 5,656,889 A | 8/1997 | Niiyama et al. |
| 5,837,935 A | 11/1998 | Carper |
| 5,882,727 A | 3/1999 | Corazza et al. |
| 5,895,233 A | 4/1999 | Higashi et al. |
| 5,921,461 A | 7/1999 | Kennedy et al. |

(Continued)

FOREIGN PATENT DOCUMENTS

EP 0 720 260 A1 7/1996

(Continued)

OTHER PUBLICATIONS

Claims of U.S. Patent No. 6,897,551 vs. Prior Art References, provided by defendant in *SAES Getters S.p.A. et al.* v. *Innovative Micro Technology, Inc.*, Case No. CV 07-2632 PA (SSx) (C.D. Cal.).

(Continued)

*Primary Examiner*—Roy K Potter
(74) *Attorney, Agent, or Firm*—TIPS Group (57) ABSTRACT

The specification teaches a technique for manufacturing microelectronic, microoptoelectronic or micromechanical devices (microdevices) in which a contaminant absorption layer improves the life and operation of the microdevice. In an embodiment, a process for manufacturing the devices includes efficiently integrating a getter material.

29 Claims, 5 Drawing Sheets

U.S. PATENT DOCUMENTS

| | | | |
|---|---|---|---|
| 5,961,750 | A | 10/1999 | Boffito et al. |
| 6,477,901 | B1 | 11/2002 | Tadigadapa et al. |
| 6,499,354 | B1 * | 12/2002 | Najafi et al. ............... 73/723 |
| 6,534,850 | B2 | 3/2003 | Liebeskind |
| 6,843,936 | B1 | 1/2005 | Jacobs |
| 6,897,551 | B2 | 5/2005 | Amiotti |
| 6,923,625 | B2 | 8/2005 | Sparks |
| 2003/0085438 | A1 | 5/2003 | Habibi et al. |
| 2003/0138656 | A1 | 7/2003 | Sparks |
| 2005/0158914 | A1 | 7/2005 | Amiotti |

FOREIGN PATENT DOCUMENTS

| | | |
|---|---|---|
| EP | 0 837 502 A2 | 4/1998 |
| EP | 0 845 728 A2 | 6/1998 |
| WO | WO 00/61832 | 10/2000 |

OTHER PUBLICATIONS

Deliverable D 1.3, (VABOND) Nov. 12, 2002, Project No. IST-2001-34224, Long-term stability of vacuum-encapsulated MEMS devices using eutectic wafer bonding.

Project presentation for publication, IST, (VABOND), Long-term stability for vacuum-encapsulated MEMS devices using eutectic wafer bonding, Proposal No. IST-2001-34224.

Project presentation for publication, IST, (VABOND), Long-term stability of cacuum-encapsulated MEMS devices using eutectic water bonding, Proposal No. IST-2001-34224.

Deliverable Report, Deliverable No. D 6.4, Project No. IST-2001-34224 (VABOND), Long-term stability of vacuum-encapsulated MEMS devices using eutectic wafer bonding.

Deliverable Report, Deliverable D3.7, (VABOND), Project No. IST-2001-34224, Long-term stability of cacuum-encapsulated MEMS devices using eutectic wafer bonding.

Deliverable Report, Deliverable D 1.3 (VABOND) dtd Nov. 12, 2002, Project No. IST-2001-34224, Long-term stability of vacuum-encapsulated MEMS devices using eutectic wafer bonding.

WSRC-TR-99-00160, Evaluation of H2 Getter Materials for Use in the TRUPACT-II, by R.R. Livingston et al., Sep. 1999.

H. Henmi, "Vacuum Packaging for Micro Sensors by Glass-Silicon Anodic Bonding", Sensors and Actuators A, 43 (1994), 243-248.

T. Corman, "Low APressure Encapsulation Techniques for Silicon Resonators", Royal Institute of Technology, Stockholm, 1998.

*SAES Getters S.p.A.*, v. *Innovative Micro Technology, Inc.*, Defendant's Claim Constructions and Invaliidity Contentions, with Exhibits.

*SAES Getters S.p.A.*, v. *Innovative Micro Technology, Inc.*, Plaintiff's Claims Construction and Infringement Contentions (Pubilc Version). Attachment to form TOPS-1465, Request for Inter Partes ReExamination.

Letter to Counsel from Sheppard Mullin.

Sparks, Douglas, NanoGetters letter and attachments, dated Oct. 29, 2008.

Notice of Reasons for Rejection from counterpart Japanese Application No. 2003-514571, Mailed: Aug. 19, 2008, Atsushi Aoki, et al.

\* cited by examiner

PROCESS FOR MANUFACTURING MICROELECTRONIC, MICROOPTOELECTRONIC OR MICROMECHANICAL DEVICES

CROSS-REFERENCE TO RELATED APPLICATIONS

This Patent Application is a Divisional of U.S. patent application Ser. No. 10/201,657, filed Jul. 19, 2002, now U.S. Pat. No. 6,897,551, entitled SUPPORT FOR MICROELECTRONIC, MICROOPTOELECTRONIC OR MICROMECHANICAL DEVICES, which is related to U.S. patent application Ser. No. 10/211,426, filed Jul. 19, 2002, entitled SUPPORT WITH INTEGRATED DEPOSIT OF GAS ABSORBING MATERIAL FOR MANUFACTURING MICROELECTRONIC, MICROOPTOELECTRONIC OR MICROMECHANICAL DEVICES, which claim priority under 35 U.S.C. 119 to Italian Applications MI-2001-A-001558, filed Jul. 20, 2001, and MI-2002-A-000688 filed Apr. 3, 2002, all of which are incorporated herein by reference.

BACKGROUND

The present invention relates to manufacturing microelectronic, microoptoelectronic, or micromechanical devices.

Microelectronic devices (also called integrated electronic circuits, or ICs) are the base of the integrated electronics industry. Microoptoelectronic devices comprise, for example, new generations of infrared radiation (IR) sensors which, unlike traditional ones, do not require cryogenic temperatures for their operation. These IR sensors are formed of an array of semiconductor material deposits, for example silicon, arranged in an evacuated chamber. Micromechanical devices (better known in the field under the definition "micromachines" or referred herein as MMs) are being developed for applications such as miniaturized sensors or actuators. Typical examples of micromachines are microaccelerometers, which are used as sensors to activate automobile airbags; micromotors, having gears and sprocket wheels of the size of a few microns (um); or optic switches, wherein a mirror surface with a size of the order of a few tens microns can be moved between two different positions, directing a light beam along two different directions, one corresponding to the "on" condition and the other to the "off" condition of an optical circuit. In the following description, these devices will also all be referred to within the general definition of solid-state devices.

ICs are manufactured by depositing layers of material with different electric (or magnetic) functionalities on a planar then selectively removing them to create the device. The same techniques of depositions and selective removal create microoptoelectronic or micromechanical devices as well. These devices are generally contained in housings formed, in their turn, with the same techniques. The support most commonly used in these productions is a silicon "slice" (usually referred to as a "wafer"), about 1 mm thick and with a diameter up to 30 cm. On each of these wafers a very high number of devices may be constructed. At the end of the manufacturing process, individual devices, in the case of micromachines, or parts, in the case of IR sensors, are separated from the slices using mechanical or laser means.

The deposition steps are carried out with such techniques as, for example, chemical deposition from vapor state, ("Chemical Vapor Deposition" or "CVD") and physical deposition from vapor state ("Physical Vapor Deposition" or "PVD"). The latter is commonly known in the art as "sputtering." Generally, selective removals are carried out through chemical or physical attacks using proper masking techniques. Such techniques are well-known in the field and will not be discussed here except as they relate to specific embodiments of the invention.

The integrated circuits and the micromachines are then encapsulated in polymeric, metallic or ceramic materials, essentially for mechanical protection, before being put to final use (within a computer, an automobile, etc.). In contract, IR radiation sensors are generally encapsulated in a chamber, facing one wall thereof, transparent to the IR radiation and known as a "window."

In certain integrated circuits it is important to be able to control the gas diffusion in solid state devices. For example, in the case of ferroelectric memories, hydrogen diffuses through device layers and can reach the ferroelectric material, which is generally a ceramic oxide, such as lead titanate-zirconate, strontium-bismuth tantalate or titanate, or bismuth-lanthanum titanate. When the hydrogen reaches the ferroelectric material, it can alter its correct functioning.

Still more important is gas control and elimination in IR sensors and in micromachines. In the case of IR sensors, the gases which may be present in the chamber can either absorb part of the radiation or transport heat by convection from the window to the array of silicon deposits, altering the correct measurement. In the case of micromachines, the mechanical friction between gas molecules and the moving part, due to the very small size of the latter, can lead to detectable deviations from the device's ideal operation. Moreover, polar molecules such as water can cause adhesion between the moving part and other parts, such as the support, thus causing the device's failure. In the IR sensors with arrays of silicon deposits or in the micromachines, it is therefore fundamental to ensure the housing remains in vacuum for the whole device life.

In order to minimize the gas amount in these devices, their production is usually conducted in vacuum chambers and resorting to pumping steps before the packaging. However, the problem is not completely solved by pumping because the same materials which form the devices can release gases, or gases can permeate from outside during the device life.

To remove the gases entering in solid state devices during their life the use of materials that can sorb these destructive gases may be helpful. These absorptive materials are commonly referred to as "getters," and are generally metals such as zirconium, titanium, vanadium, niobium or tantalum, or alloys thereof combined with other transition elements, rare earths or aluminum. Such materials have a strong chemical affinity towards gases such as hydrogen, oxygen, water, carbon oxides and in some cases nitrogen. The absorptive materials also include the drier materials, which are specifically used for moisture absorption, which usually include the oxides of alkali or alkaline-earth metals. The use of materials for absorbing gases, particularly hydrogen, in ICs, is described for instance in U.S. Pat. No. 5,760,433 by Ramer et al. Ramer teaches that the chemically reactive getter material is formed as part of the process of fabricating the integrated circuit. The use of getters in IR sensors is described in U.S. Pat. No. 5,921,461 by Kennedy et al. Kennedy teaches that a getter is deposited onto preselected regions of the interior of the package. Finally, the use of gas absorbing materials in micromachines is described in the article "Vacuum packaging for microsensors by glass-silicon anodic bonding" by H. Henmi et al., published in the technical journal Sensors and Actuators A, vol. 43 (1994), at pages 243–248.

The above references teach that localized deposits of gas absorbing materials can be obtained by CVD or sputtering during solid-state device production steps. However, this procedure can be costly and time consuming if done during the solid-state manufacturing CVD or sputtering process. This is because gas absorbing material deposition during device production implies the step involved in localized deposition of the gas absorbing or getter material. This is generally carried out through the steps of resin deposition, resin local sensitization through exposure to radiation (generally UV), selective removal of the photosensitized resin, gas absorbing material deposition and subsequent removal of the resin and of the absorbing material thereon deposed, leaving the gas absorbing material deposit in the area in which the photosensitized resin had been removed. Moreover, depositing the gas absorbing material in the production line is disadvantageous because there are an increased number of steps required in the manufacturing process. Increasing deposits, in turn, requires that more materials be used, which also significantly increases the risk of "cross-contamination" among the different chambers in which the different steps are carried out. Also, there is a possible increase of waste products because of contamination.

SUMMARY

In various embodiments, one or more of the above-described problems have been reduced or eliminated.

In an embodiment, a process for manufacturing a device for use in the production of a microdevice may include creating a support device by deposing discrete deposits of contaminant removing material on a base layer. The base layer may or may not include a material selected from the group consisting of glasses, ceramics, semiconductors or metals. The contaminant removing material may or may not include getter material or drier material.

In another embodiment, a process for manufacturing a device for use in the production of a microdevice may include covering contaminant removing material with a manufacturing layer. The manufacturing layer may or may not be a substrate layer which may be used in the manufacture of the microdevice.

In another embodiment, a process for manufacturing a device for use in the production of a microdevice may include removing selected materials in the manufacturing layer creating a passage in the manufacturing layer. This may or may not expose the contaminant removing material to atmosphere. The passages may or may not create cavities.

In another embodiment, the process may include attaching the support device. This may or may not result in the support device covering operational parts of the microdevice. Also, this may or may not result in a seal being formed at the periphery of the cavity by the support device and the microdevice. The operational parts may be placed the cavity by removing some or all of the layer of manufacturing material.

Another embodiment according to the technique includes forming one or more discrete deposits of getter material on a cover, forming one or more devices on a base, placing at least part of the cover over at least part of the base, and hermetically sealing at least one device and at least one discrete deposit within a cavity at least partially defined by the at least part of the cover and the at least part of the base.

Another embodiment according to the technique includes configuring a cover layer with one or more hollows, forming discrete getter layers in the one or more hollows of the cover layer, and using the cover layer as a covering element in the production of a microdevice. In an embodiment, one of the hollows may at least partially define a cavity that includes a discrete getter layer.

BRIEF DESCRIPTION OF THE DRAWINGS

Embodiments of the invention are illustrated in the figures. However, the embodiments and figures are illustrative rather than limiting; they provide examples of the invention.

In the figures, similar reference numerals may denote similar components.

DETAILED DESCRIPTION

For the sake of description clarity, in the drawings height-diameter ratio of supports of the invention and lateral dimensions of gas absorbing material deposits upon the base are exaggerated with respect to real dimensions. Moreover, in the drawings, supports are always represented with a wafer geometry, that is a low disk of material, because this is the geometry commonly adopted by the producers of solid state devices, but this geometry could be also different, for example square or rectangular.

Figure 1:
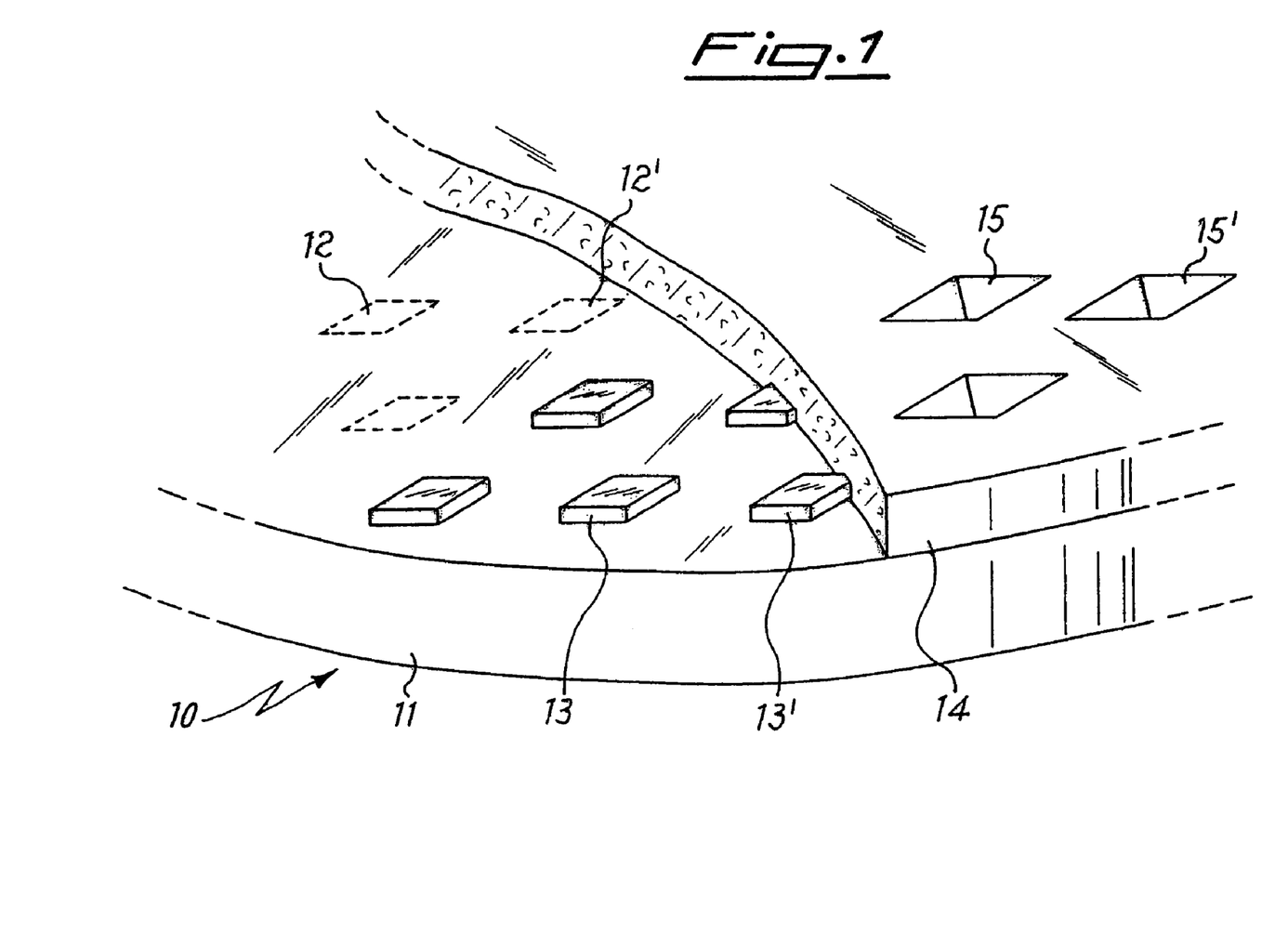
FIG. 1 shows in perspective, partially in section, a first embodiment of the invention.

In FIG. 1 is shown a partial sectional view of a support 10 according to a first embodiment of the invention. Said support, 10, comprises a base, 11, having the only function of backing the support and devices deriving therefrom, and constitutes nearly the whole thickness of support 10 (within the range of millimeters). Base material can be a metal, a ceramic, a glass ora semiconductor, preferably silicon.

In areas 12, 12', . . . , of the surface of base layer 11, discrete deposits 13, 13', . . . of a contaminant removing material (also referred to as gas absorbing material) are obtained. Then these deposits are covered with a layer 14 of a material compatible with ICs or MMs production process. The covering layer 14 can act as the anchor for layers subsequently deposited thereon to construct ICs, microoptoelectronic devices or MMs. In a preferred embodiment the covering layer can be even itself the layer in which these devices are constructed (for example the moving parts of micromachines can be obtained in this layer by removing parts of it). Moreover the final device's soldering can be possibly made directly on the edge of covering layer 14.

Figure 2:
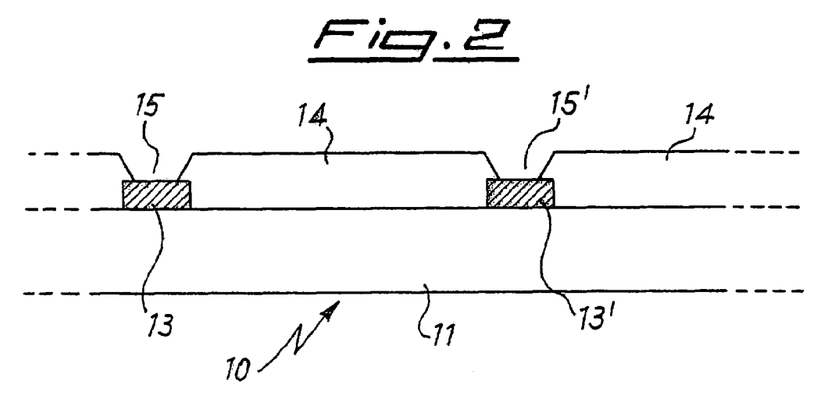
FIG. 2 shows a sectional view of the support in FIG. 1.

As shown in FIG. 2, in covering layer 14, in correspondence of deposits 13, 13', . . . , are realized passages 15, 15', . . . , having function of exposing the gas absorbing or contaminant removing material 13, 13', . . . to the atmosphere surrounding support 10. Passages 15, 15', . . . , can be made by selective removal of covering layer 14 upon deposits 13, 13', . . . , through removing techniques that are known by those skilled in the art.

The gas absorbing material utilized for deposits 13, 13', . . . can be any material free from the phenomenon of lost (or losing) particles, chosen among materials commonly called getter materials, which are capable of absorbing various gas molecules, and drier materials, which are specifically used for the absorption of water vapor.

In one embodiment of the invention a getter material may be used as a contaminant removing material. The getter material can be a metal such as Zr, Ti, Nb, Ta, V; an alloy of these metals or one or more of these elements and additional element(s), preferably chosen from Cr, Mn, Fe, Co, Ni, Al, Y, La and rare-earths, like binary alloys Ti—V, Zr—V, Zr—Fe and Zr—Ni, ternary alloys like Zr—Mn—Fe or Zr—V—Fe, or alloys with more components. In a preferred embodiment of the invention, getter materials are titanium, zirconium, the alloy of weight percentage composition Zr 84%-Al 16%, produced and sold by the Applicant under the trade name St 101®, the alloy of weight percentage composition Zr 70%-V 24.6%-Fe 5.4%, produced and sold by the Applicant under the trade name St 707® and the alloy of weight percentage composition Zr 80.8%-Co 14.2%-TR 5% (wherein TR stands for a rare-earth, yttrium, lanthanum or mixtures thereof), produced and sold by the Applicant under the trade name St 787®. In case the getter material is not completely free of the "lost particles" phenomenon, it can be properly treated so as to reduce or eliminate this phenomenon, through a partial sintering or annealing treatment or other techniques which are appreciated by those skilled in the art.

In another embodiment of the invention, drier materials are used for the contaminant-removing material 13, 13'. . . . In the case of the drier materials, these are preferably chosen among the oxides of alkali or alkaline-earth metals. Calcium oxide, CaO, is used in a preferred embodiment, because it does not pose safety or environmental problems during production, use or disposal of devices containing it. An oxide layer may be obtained, for instance through the so-called "reactive sputtering" technique, depositing the alkali or alkaline-earth metal under an atmosphere of a rare gas (generally argon) in which a low percentage of oxygen is present, so that the metal is converted to its oxide during deposition. These layers are generally compact and free from the problem of lost particles. In a preferred embodiment, there is only getter material, but in alternate embodiments there are getter and drier materials or just drier materials.

Deposits 13, 13', . . . , can be obtained through known techniques of selective deposition, and have thickness in the range between about 0.1 and 5 µm: with thickness values lower than the indicated ones, gas sorption capability is excessively reduced, while with higher thickness values deposition times are extended without any real advantages on the sorption properties of the contaminant removing materials. These deposits have lateral dimensions variable within wide ranges and depend on the intended use of a completed device. For example, if utilization is expected in ICs, lateral dimension will be within the range of a few microns or less, while in the case of MMs, dimensions can be between a few tens and a couple thousands of microns.

Material constituting layer 14 is one of the materials normally used as substrate in solid state devices production; it can be a so-called "III–V material" (for example, GaAs, GaN, or InP), or silicon in a preferred embodiment. Covering layer 14 can be obtained by sputtering, epitaxy, CVD or by others techniques known to those skilled in the art. It has a variable thickness, which is generally lower than 60 µm in areas free from deposits 13, 13', . . . , and preferably within the range of about 1–20 µm.

In order to help adhesion, covering layer 14 is may be made from the same material as base 11. In a preferred embodiment the combination is silicon (mono- or polycrystalline) for base 11, and silicon grown by epitaxy for layer 14. However, those skilled in the are would appreciated that other materials with similar adhesion properties could be used as well and that the base and adhesion layer do not need to be made from the same material in an alternate embodiment.

The upper surface of covering layer 14 can also be treated by modifying its chemical composition, for example forming an oxide or a nitride, allowing the following operations included in device production to occur.

Various embodiments can therefore be used in the production of solid-state devices of every kind. In completed devices which are ready for utilization or commercialization, deposits of gas absorbing material are "uncovered," that is, exposed to external atmosphere. To avoid the risk of excessive passivation and damaging of the absorbing or contaminant-removing material, it is preferable to keep devices inside boxes under inert atmosphere, for instance argon or dry nitrogen, as would be appreciated by those skilled in the art.

Figure 3:
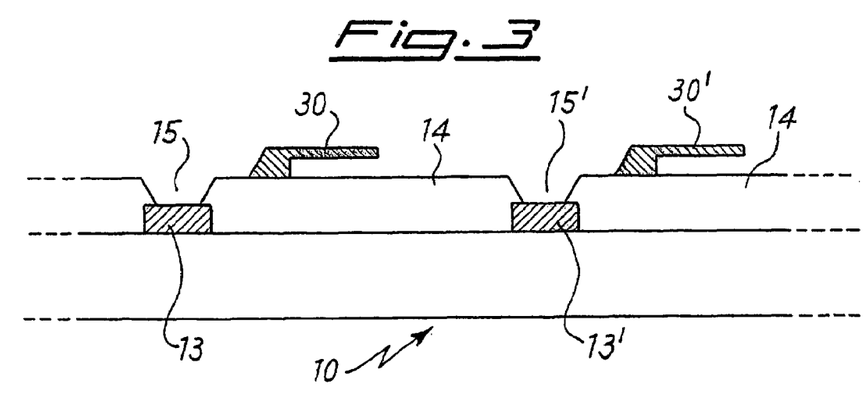
FIGS. 3–5 represent operative phases for constructing a solid-state device starting from the support of FIG. 1.
Figure 4:
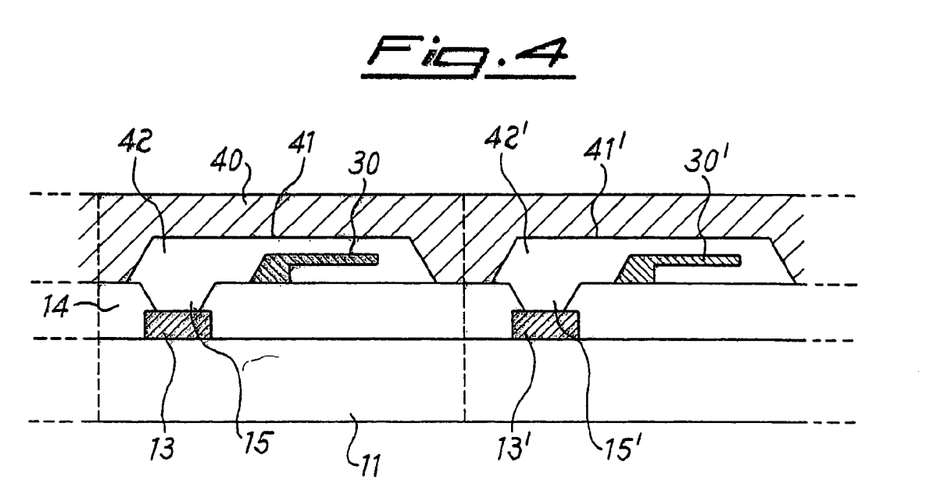
Figure 5:
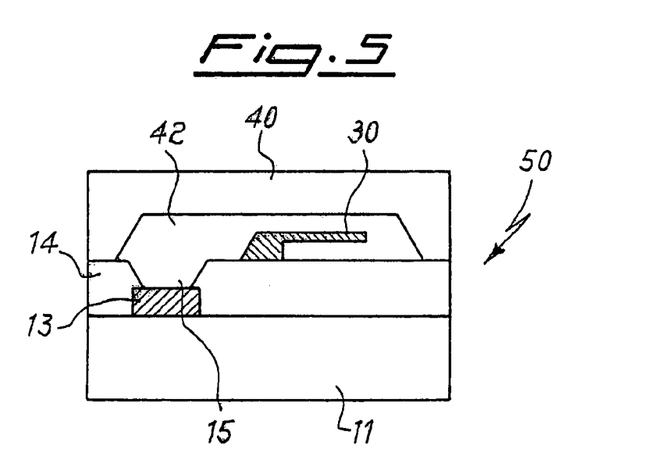

FIGS. 3–5 show a possible implementation of an embodiment of the invention, where the support 10 is used in solid-state device production, particularly micromachine production. However, the same support could be utilized for manufacturing other solid-state devices, such as integrated circuits or miniature IR sensors.

Upon areas of surface of layer 14 without passages 15, 15', . . . , are manufactured structures comprising micromachine mobile parts, labelled as elements 30, 30', . . . in FIG. 3. When the production for structures 30, 30', . . . (including contacts for outside electric connection of every single micromachine, not shown in the drawing) is finished, a covering element 40 is placed over support 10, as shown in section in FIG. 4. This covering element 40 is generally constructed with the same materials as the base 11 and it has to be easily fixable to layer 14. Silicon is used in a preferred embodiment. The covering element 40 can have holes, 41, 41', . . . , in correspondence with areas wherein, on support 10, structures 30, 30', . . . , are obtained and deposits 13, 13', . . . , of gas absorbing material are exposed. In particular each of said holes will be so wide that, when support 10 and covering element 40 are fixed together, a space 42, 42', . . . , is obtained wherein a structure like 30, 30', . . . , and a passage 15, 15', . . . , giving access to the gas absorbing material, are contained, so that this latter is in direct contact with space 42, 42', . . . , and is able to sorb gas possibly present or released during time in said space. Finally, single micromachines, as the one represented in FIG. 5, are obtained by cutting the whole made up of support 10 and covering element 40 along their adhesion areas.

Figure 6:
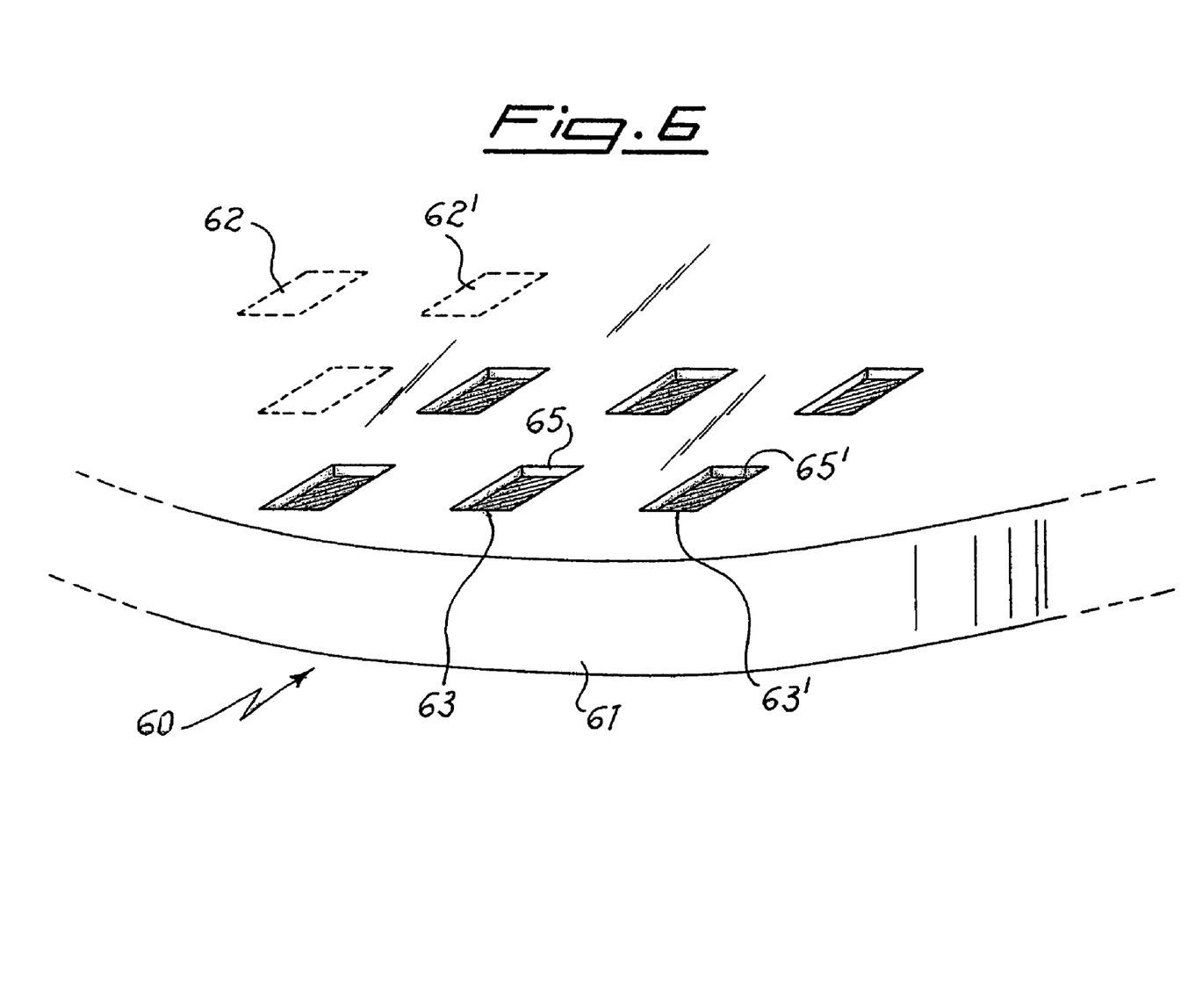
FIG. 6 shows in perspective, partially in section, a second possible support according to the invention.
Figure 7:
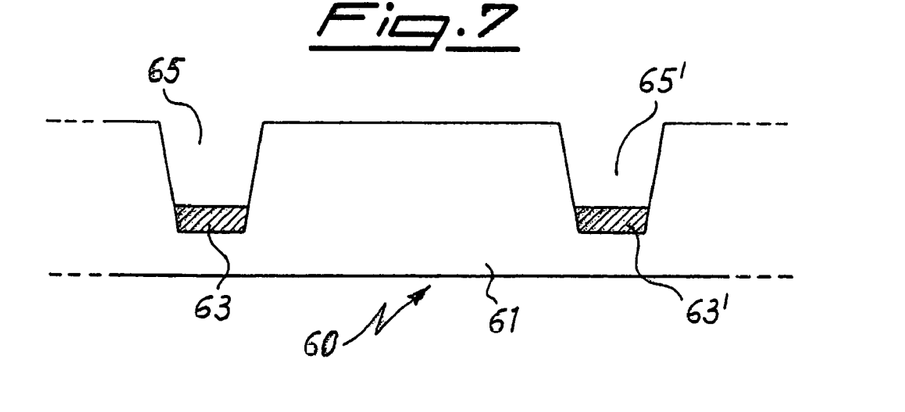
FIG. 7 shows a sectional view of support in FIG. 6.

FIGS. 6 and 7 show, partially in section, a second possible embodiment of the invention. Also in this embodiment the support 60 includes a base 61 of the same kind and dimensions of base 11 previously described, but in which hollows 65, 65', . . . , are created in localized areas 62, 62', . . . , and fitted to contain gas absorbing material deposits 63, 63', . . . . Because of the hollows configuration, the base 61 in this embodiment can substitute the assembly made up of base 11 and layer 14 in the embodiment described above.

Figure 8:
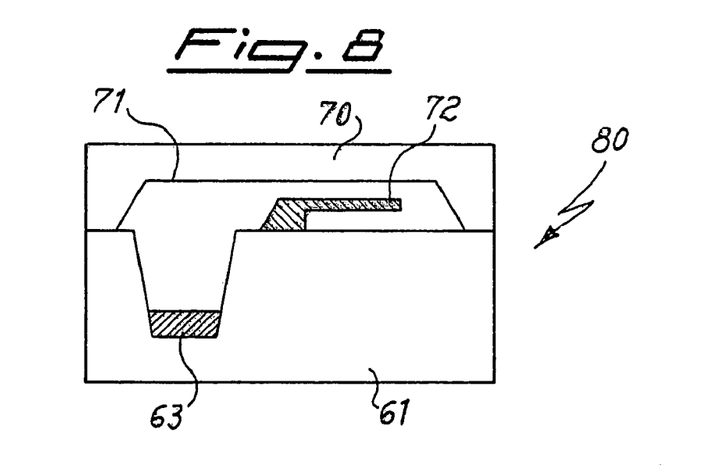
FIG. 8 represents a solid-state device obtainable from support of FIG. 6.

FIG. 8 represents a solid-state device 80, in particular a micromachine, which can be obtained from the support of an alternate embodiment of the invention 60 of FIGS. 6 and 7, through a process similar to the one described with reference to FIGS. 3–5 and utilizing a covering element 70 provided with holes 71, 71', . . . , in correspondence with areas wherein, on support 60, structures 72, 72', . . . , are disposed and gas absorbing material deposits 63, 63', . . . , are exposed.

Figure 9:
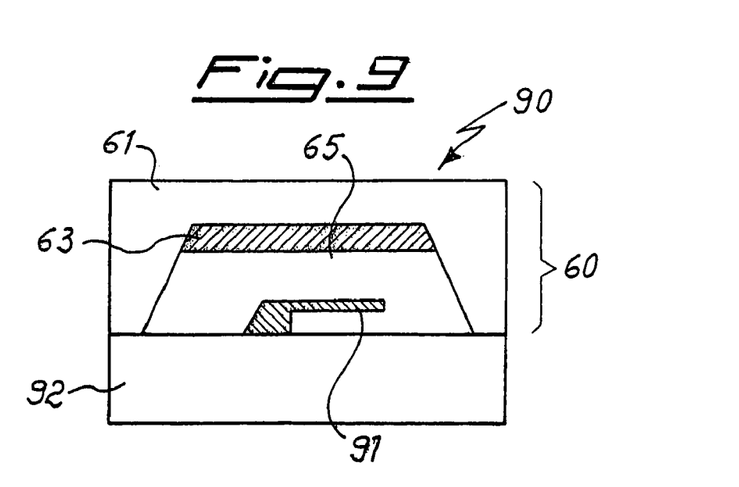
FIG. 9 shows a sectional view of another solid state-device constructed starting from the support of FIG. 6.

In another alternate embodiment as shown in FIG. 9, micromachine 90 uses the support 60 as a covering element of a solid-state device instead of as base. In this embodiment, the base on which micromachine is constructed is a traditional one as is known by those skilled in the art, without gas absorbing material deposits. The hollow 65 obtained inside base 61, forms thus a space for housing the mobile structure 91 and, at the same time, creates the passage 64) giving access to gas absorbing material.

The invention is applicable to microdevices of any type which can benefit from an internally deposed gettering layer as defined by the invention. A microdevice is described as any of microelectronic, microoptoelectronic, or micromechanical device. However, any small-scale device which requires purification for contaminants which passes through channels cut into the substrate layer, which allow deposits of contaminant removing material to capture contaminants will benefit from the scope and spirit of the invention and the invention should not be limited to only the three types of applications recited, but rather be defined by the claims below.

It will be appreciated to those skilled in the art that the preceding examples and preferred embodiments are exemplary and not limiting to the scope of the present invention. It is intended that all permutations, enhancements, equivalents, and improvements thereto that are apparent to those skilled in the art upon a reading of the specification and a study of the drawings are included within the true spirit and scope of the present invention.

What is claimed is:

1. A process for manufacturing a device for use in the production of a microdevice including the steps of:
    creating a support device by depositing discrete deposits of contaminant removing material on a base layer of a material selected from the group consisting of glasses, ceramics, semiconductors and metals, wherein said contaminant removing material is selected among the group of materials consisting of getter materials and drier materials;
    covering said contaminant removing material by a manufacturing layer, wherein said manufacturing layer is a substrate layer which may be used in the manufacture of said microdevice;
    removing selected materials in said manufacturing layer creating a passage in said manufacturing layer, such that said contaminant removing material is exposed to atmosphere, wherein said passages create; and
    attaching said support device such that it covers operational parts of said microdevice and a seal is created at the periphery of said cavity by said support device and said microdevice, whereby said operational parts are placed in said cavity from removed layer of manufacturing material.

2. The process as recited in claim 1, further comprised of the step of storing said covered support device in an inert atmosphere prior to use.

3. A process comprising:
    creating a support device by depositing discrete deposits of contaminant removing material at a thickness of between about 0.1 to 5 μm on a base layer of a material selected from the group consisting of glasses, ceramics, semiconductors and metals, wherein said contaminant removing material is selected among the group of materials consisting of getter materials and drier materials;
    covering said contaminant removing material by a manufacturing layer, wherein said manufacturing layer is a substrate layer which may be used in the manufacture of a microdevice;
    removing selected portions of said manufacturing layer creating a passage in said manufacturing layer, such that said contaminant removing material is exposed to atmosphere, wherein said passages create cavities.

4. The process as recited in claim 3, further comprising:
    attaching said support device, wherein the support device covers operational parts of said microdevice;
    creating a seal around the periphery of one of said cavities, wherein said cavity is at least partially defined by said support device and said microdevice;
    removing one or more layers of manufacturing material, wherein operational parts are placed in one of said cavity from the removed layers of manufacturing material.

5. The process as recited in claim 3, further comprising storing said covered support device in an inert atmosphere prior to use.

6. The process as recited in claim 3, further comprising configuring the base layer with one or more hollows fitted to comprise said discrete deposits of contaminant removing material.

7. The process as recited in claim 3, further comprising forming the manufacturing layer to a thickness of between about 1 to 20 μm.

8. A method for providing multiple microdevices comprising:
    forming a first base, including a plurality of microdevice bases, where each microdevice base is provided with at least one component;
    forming a second base, including a plurality of covers, where each cover is provided with a recess holding getter material;
    juxtaposing the first base and the second base to form a compound structure;
    separating the microdevices from the compound structure.

9. The method of claim 8, further comprising forming at least one hollow in the first base, wherein the at least one component is formed in the at least one hollow.

10. The method of claim 8, further comprising forming at least one hollow in the second base, wherein the getter material is formed in the at least one hollow.

11. The method of claim 8, further comprising exposing the at least one component and the getter material to an atmospheric environment of a cavity at least partially defined by the first base and the second base.

12. The method of claim 8, further comprising:
    forming on the second base a layer of a material compatible with the production of microelectronic or micromechanical devices or parts thereof
    forming passages in the layer, wherein the passages facilitate atmospheric contact between the getter material and an atmospheric environment of the at least one component.

13. A method comprising:
    forming a base, including a plurality of covers, where each cover is provided with a recess holding getter material;
    forming on the base a production process-compatible layer of a material compatible with the production of microelectronic or micromechanical devices or parts thereof;
    providing the base in a production process in which passages are formed in the production process-compatible layer.

14. The method of claim 13, wherein the base is a first base, further comprising:
    forming a second base, including a plurality of microdevice bases, where each microdevice base is provided with at least one component;
    engaging the first base with the second base.

15. The method of claim 14, further comprising forming a component of the microdevice on the second base, wherein, when engaging the first base with the second base, the component of the microdevice is located within a cavity at least partially defined by a recess holding getter material.

16. The method of claim 14, forming passages in the production process-compatible layer, wherein the passages facilitate contact between the getter material and an atmospheric environment of the at least one component.

17. The method of claim 13, further comprising forming the getter material in each cover of the base.

18. The method of claim 13, further comprising forming the getter material to a thickness of between about 0.1 to 5 µm.

19. The method of claim 13, further comprising forming the production process layer to a thickness of between about 1 to 20 µm.

20. A process comprising:
creating a support device by deposing discrete deposits of contaminant removing material on a base layer of a material selected from the group consisting of glasses, ceramics, semiconductors and metals, wherein said contaminant removing material is selected among the group of materials consisting of getter materials and drier materials;
covering said contaminant removing material by a manufacturing layer to a thickness of between about 1 to 20 µm, wherein said manufacturing layer is a substrate layer which may be used in the manufacture of said microdevice; and
removing selected portions of said manufacturing layer creating a passage in said manufacturing layer, such that said contaminant removing material is exposed to atmosphere, wherein said passages create cavities.

21. The process as recited in claim 20, further comprising:
attaching said support device, wherein the support device covers operational parts of said microdevice;
creating a seal around the periphery of one of said cavities, wherein said cavity is at least partially defined by said support device and said microdevice;
removing one or more layers of manufacturing material, wherein operational parts are placed in one of said cavity from the removed layers of manufacturing material.

22. The process as recited in claim 20, further comprising storing said covered support device in an inert atmosphere prior to use.

23. The process as recited in claim 20, further comprising configuring the base layer with one or more hollows fitted to comprise said discrete deposits of contaminant removing material.

24. A method for providing multiple microdevices comprising:
forming a first base, including a plurality of microdevice bases, where each microdevice base is provided with at least one microdevice component;
forming a second base, including a plurality of covers, where each cover is provided with a recess;
depositing contaminant removing material into each recess of each cover, wherein said contaminant removing material is selected among the group of materials consisting of getter materials and drier materials;
juxtaposing the first base and the second base to form a compound structure; and
separating the microdevices from the compound structure.

25. A method for providing multiple microdevices comprising:
forming a first base, including a plurality of microdevice bases, where each microdevice is provided with at least one microdevice component;
forming a second base, including a plurality of covers, where each cover is provided with a recess;
depositing contaminant removing material in a thickness of between about 0.1 to 5 µm into each recess of each cover, wherein said contaminant removing material is selected among the group of materials consisting of getter materials and drier materials;
juxtaposing the first base and the second base to form a compound structure; and
separating the microdevices from the compound structure.

26. A method for providing multiple microdevices comprising:
forming a first wafer, including a plurality of microdevice bases, where each microdevice is provided with at least one microdevice component;
forming a second wafer, including a plurality of covers, where each cover is provided with a recess;
depositing contaminant removing material into each recess of each cover, wherein said contaminant removing material is selected among the group of materials consisting of getter materials and drier materials;
fixing together the first wafer and the second wafer to form a compound structure; and
separating the microdevices from the compound structure.

27. A method of providing multiple microdevices comprising:
forming a first wafer, including a plurality of microdevice bases, where each microdevice base is provided with at least one microdevice component;
forming a second wafer, including a plurality of covers, where each cover is provided with a recess;
depositing contaminant removing material in a thickness of between about 0.1 to 5 µm into each recess of each cover, wherein said contaminant removing material is selected among the group of materials consisitng of getter materials and drier materials;
fixing together the first wafer and the second wafer to form a compound structure; and
separating the microdevices from the compound structure.

28. A method for providing multiple microdevices comprising:
forming a first wafer, including a plurality of microdevice bases, where each microdevice base is provided with at least one microdevice component;
forming a second wafer, including a plurality of covers, where each cover is provided with a recess;
depositing contaminant removing material into each recess of each cover through the use of selective deposition, wherein said contaminant removing material is selected among the group of materials consisting of getter materials and drier materials;
fixing together the first wafer and the second wafer to form a compound structure; and
separating the microdevices from the compound structure.

29. A method for providing multiple microdevices comprising:
forming a first wafer, including a plurality of microdevice bases, where each microdevice base is provided with at least one microdevice component;
forming a second wafer, including a plurality of covers, where each cover is provided with a recess;
depositing contaminant removing material into each recess of each cover through the use of sputtering, wherein said contaminant removing material is selected among the group of materials consisting of getter materials and drier materials; and
fixing together the first wafer and the second wafer to form a compound structure;
separating the microdevices from the compound structure.

* * * * *